US008249845B1

(12) United States Patent
Britch et al.

(10) Patent No.: US 8,249,845 B1
(45) Date of Patent: Aug. 21, 2012

(54) ELECTRO-MECHANICAL SYSTEM SIMULATOR ARRANGEMENT AND METHOD

(75) Inventors: Peter F. Britch, Miller Place, NY (US); Emery Korpi, Syosset, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 1102 days.

(21) Appl. No.: 12/099,874

(22) Filed: Apr. 9, 2008

Related U.S. Application Data

(60) Provisional application No. 60/915,701, filed on May 3, 2007.

(51) Int. Cl.
    *G06F 17/50* (2006.01)
(52) U.S. Cl. ........................................................ 703/13
(58) Field of Classification Search .................. 703/13
    See application file for complete search history.

(56) References Cited

U.S. PATENT DOCUMENTS

| | | | |
|---|---|---|---|
| 4,901,221 A | 2/1990 | Kodosky et al. |
| 5,576,946 A | 11/1996 | Bender et al. |
| 5,640,572 A | 6/1997 | Mondrik et al. |
| 5,710,727 A | 1/1998 | Mitchell et al. |
| 5,724,272 A | 3/1998 | Mitchell et al. |
| 5,784,275 A | 7/1998 | Sojoodi et al. |
| 5,847,953 A | 12/1998 | Sojoodi et al. |
| 5,847,955 A | 12/1998 | Mitchell et al. |
| 5,905,649 A | 5/1999 | Sojoodi et al. |
| 5,920,479 A | 7/1999 | Sojoodi et al. |
| 6,009,256 A | 12/1999 | Tseng et al. |
| 6,049,764 A | 4/2000 | Stahl |
| 6,078,320 A | 6/2000 | Dove et al. |
| 6,173,438 B1 | 1/2001 | Kodosky et al. |
| 6,311,149 B1 | 10/2001 | Ryan et al. |
| 6,418,391 B1 | 7/2002 | Umezu et al. |
| 6,418,392 B1 | 7/2002 | Rust et al. |
| 6,496,860 B2 | 12/2002 | Ludtke et al. |
| 6,715,139 B1 | 3/2004 | Kodosky et al. |
| 6,788,980 B1 | 9/2004 | Johnson |
| 6,802,053 B1 | 10/2004 | Dye et al. |
| 6,868,538 B1 | 3/2005 | Nixon et al. |
| 6,879,926 B2 | 4/2005 | Schmit et al. |
| 6,891,737 B1 | 5/2005 | Matsubara et al. |
| 7,280,955 B2 | 10/2007 | Martin |

OTHER PUBLICATIONS

RASSP Architecture Guide, Lockheed Sanders, Inc., Hughes Aircraft, Motorola, and ISX Corp., tech. report, Rev. B, RASSP, Jan. 1995, http://rassp.sanders.com. pp. 1-106.*
Paramasivam et al., "Real Time Hybrid Controller Implementation for Switched Reluctance Motor Drive", American Journal of Applied Sciences 1 (4): 284-294, 2004.
Husain, Iqbal "Switched Relucance Motor Drives: Basic and Research Trends", Jul. 2003, pp . 1-66.
Signalogic "A16D16 Multichannel ADC/DAC Module", Jul. 2000, pp. 1-3.
Altera "FPGAs Provide Reconfigurable DSP Solutions", White Paper, Aug. 2002, pp. 1-6.
J. Scott Calhoun et al., Developing and Distributing Component-Level VHDL Models, Jan. 1997, Springer Netherlands, col. 15, Nos. 1-2, pp. 111-126.

* cited by examiner

*Primary Examiner* — Hugh Jones
(74) *Attorney, Agent, or Firm* — Brian Roffe

(57) ABSTRACT

Arrangement and method for simulating electro-mechanical systems includes a simulator for simulating an operating environment of a plurality of different electro-mechanical systems, a first interface unit for enabling the simulator to interface with a host computer and input/output devices, and a second interface unit for enabling the simulator to be reprogrammed and re-configured to enable simulation of the operating environment of the different electro-mechanical systems. The simulator may include a user-programmable field programmable gate array and a digital signal processing unit coupled to the field programmable gate array.

20 Claims, 4 Drawing Sheets

Hardware-in-the-Loop Block Diagram

Hardware-in-the-Loop (HIL) Concept Diagram

ELECTRO-MECHANICAL SYSTEM SIMULATOR ARRANGEMENT AND METHOD

CROSS REFERENCE TO RELATED APPLICATION

This application claims priority under 35 U.S.C. §119(e) of U.S. provisional patent application Ser. No. 60/915,701 filed May 3, 2007, incorporated by reference herein.

FIELD OF THE INVENTION

The present invention relates generally to an electronic apparatus capable of simulating, electro-mechanical systems and more particularly to an electronic apparatus resident on a single VXI "C" size card which is capable of simulating a variety of electro-mechanical systems. For example, the present invention relates to an electronic apparatus capable of simulating electro-mechanical systems in real-time.

The present invention also relates generally to a method for simulating a variety of different electro-mechanical systems using the same electronic apparatus and more particularly to a method for simulating multiple and different electro-mechanical systems using a common VXI "C" size card.

BACKGROUND OF THE INVENTION

Testing an electro-mechanical system typically involves connecting the actual electro-mechanical system to test equipment, i.e., connecting the physical hardware of the system to the test equipment. Since this requires the physical hardware in place, it is often difficult to readily test such systems. Moreover, it is not possible to quickly test multiple re-configurations of the systems.

It would therefore be desirable to be able to simulate electro-mechanical systems for testing or other purposes without having the systems physically present, or without even configuring the systems, and also to enable the simulation of multiple and different electro-mechanical systems with a minimum of effort so that such simulated systems can be quickly configured and tested.

OBJECTS AND SUMMARY OF THE INVENTION

It is an object of one or more embodiments of the present invention to provide a new electronic apparatus capable of simulating electro-mechanical systems.

It is another object of the present invention to provide a new and improved method for simulating a variety of different electro-mechanical systems using the same electronic apparatus.

In order to achieve one or more of these objects and others, a first embodiment of an arrangement which simulates electro-mechanical systems in accordance with the invention includes a simulator for simulating an operating environment of a plurality of different electro-mechanical systems, a first interface unit for enabling the simulator to interface with a host computer and input/output devices, and a second interface unit for enabling the simulator to be reprogrammed and re-configured to enable simulation of the operating environment of the different electro-mechanical systems. The simulator may include a user-programmable field programmable gate array and a digital signal processing unit coupled to the field programmable gate array, with the first interface unit also being coupled to the field programmable gate array. The second interface unit may include a first JTAG interface connected to the field programmable gate array and a second JTAG interface connected to the digital signal processing unit.

In a preferred embodiment, the simulator is arranged on a single instrument adapted for insertion into a single slot of the host computer, and the first interface unit is arranged on the single instrument. A memory component may be coupled to the simulator and also arranged on the single instrument. In this embodiment, the first interface unit may comprise an interface module connectable to the host computer and at least one input/output module connected to the interface module. Each input/output module is connectable to an input/output device. The interface module may be arranged on the single instrument. The interface module is preferably arranged to manage signals between the field programmable gate array, an interface to the host computer and any input/output modules. The interface module may be a fixed configuration field programmable gate array.

An exemplifying method for simulating electro-mechanical systems in accordance with the invention includes creating a plurality of programs to be implemented by a simulator capable of simulating the operating environment of different electro-mechanical systems, mounting the simulator on a single instrument card, inserting the single instrument card into connection with a host computer, mounting an interface module on the single instrument card and coupling it to the simulator to enable the simulator to be linked to input/output devices, directing programs created for a particular electro-mechanical system to the simulator to program and configure the simulator to simulate that electro-mechanical system, directing control signals from the input/output devices to the simulator through the interface module and monitoring feedback signals from the simulator.

Optionally, a memory component is mounted on the single instrument card and coupled to the simulator so that results of the simulation may be captured in the memory component. Signals between the simulator, the host computer and the input/output devices may be managed by or via the interface module.

When the simulator includes a user-programmable field programmable gate array and a digital signal processing unit, creation of programs may entail creating commands or programs for each of the field programmable gate array and the digital signal processing unit and directing the commands or programs to each of the field programmable gate array and digital signal processing unit via respective interfaces.

The interface module may be provided with a plurality of connections for receiving input/output modules capable of linking to the input/output devices.

The control signals being directed to the simulator may be varied based on previously generated feedback signals. Also, the control signals may be generated to be indicative of those which would be generated by external components coupled to the actual electro-mechanical system being simulated.

Other and further objects, advantages and features of the present invention will be understood by reference to the following specification in conjunction with the annexed drawings, wherein like parts have been given like numbers.

BRIEF DESCRIPTION OF THE DRAWINGS

The following drawings are illustrative of embodiments of the invention and are not meant to limit the scope of the invention as encompassed by the claims.

DETAILED DESCRIPTION OF THE INVENTION

Figure 1:
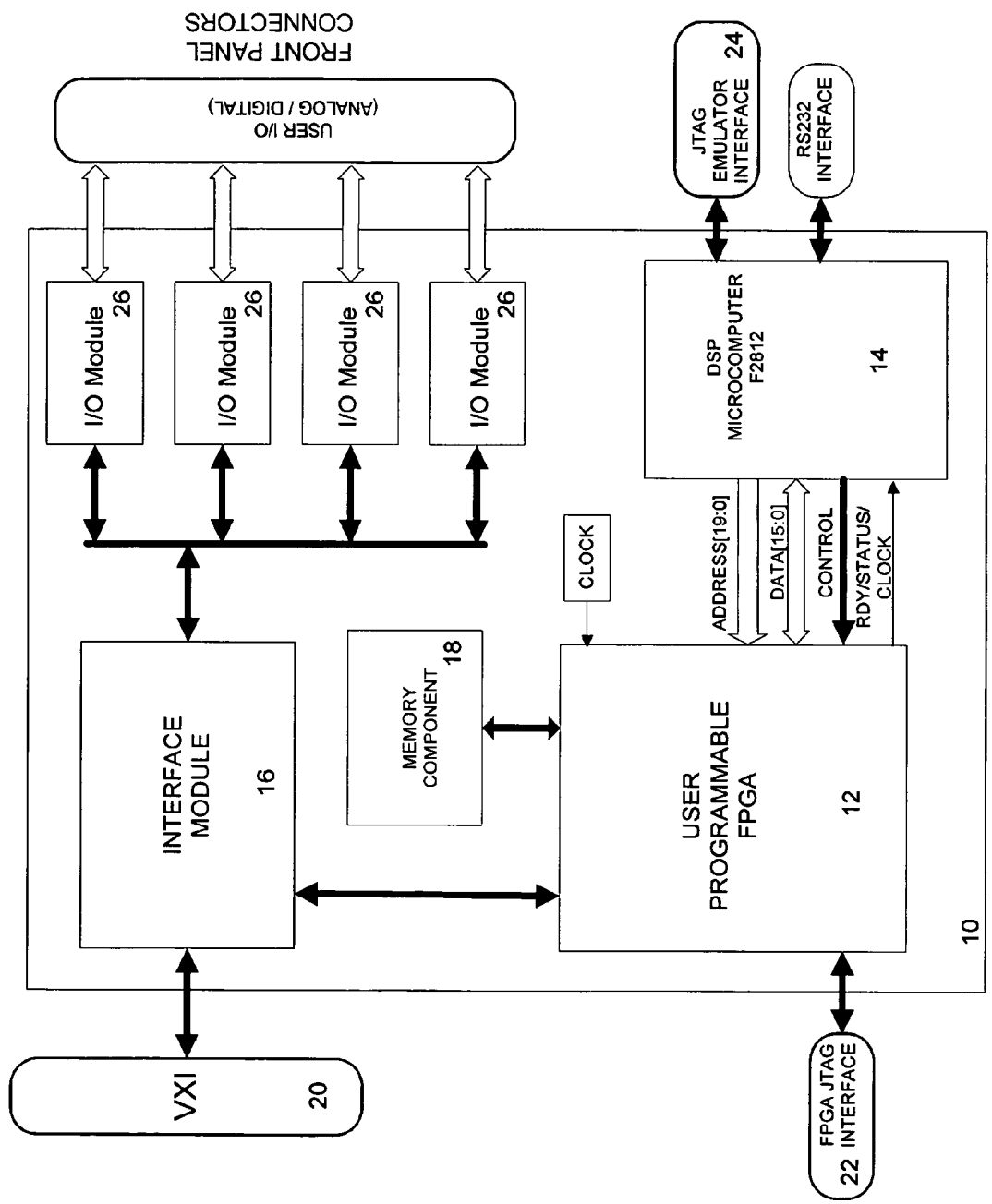
FIG. 1 is a functional block diagram showing an exemplifying system in accordance with the invention.

Referring to the accompanying drawings wherein like reference numerals refer to the same or similar elements, FIG. 1 is a functional block diagram of an exemplifying system in accordance with the invention for simulating an electro-mechanical system which is designated generally as 10. System 10 includes a field programmable gate array (FPGA) 12, a digital signal processing unit (DSP) 14 coupled to the FPGA 12, a memory component 18 coupled to FPGA 12, and an interface module 16 also coupled to the FPGA 12. In combination, the FPGA 12 and DSP 14, in conjunction with the internal configuration and firmware, is capable of electrically simulating the operating environment of a unit-under-test (UUT) system in real-time.

In a preferred embodiment, the entire system 10 is implemented on a single "C" size card adapted for insertion into a slot of a computer. The rear of the card is connected to the industry standard VXI interface 20, while the front of the card is available to connection to various devices, discussed below.

The system 10 is re-programmable and re-configurable via software and hardware means. For example, the FPGA 12 and DSP 14 may be programmed via JTAG interfaces 22, 24 positioned on the front of the card on which the system 10 is implemented. Additionally, the configuration and firmware data may be downloaded via the control interface 20. The hardware configuration of the FPGA 12 and firmware algorithms for the DSP 14 may be modified through programming in order to implement the characteristics and optionally the test routines for various UUTs. These modifications are implemented using the JTAG interfaces 22, 24 or interface 20. FPGA JTAG interface 22 is coupled directly to the FPGA 12 and JTAG emulator interface 24, an external interface, is coupled directly to the DSP 14. The JTAG emulator coupled to the interface 24 may be a Spectrum Digital, Inc JTAG emulator or another type of emulator capable of performing similar functions.

Configuration of the FPGA 12 may be achieved using Verilog or VHDL hardware description languages. Firmware algorithms for the DSP 14 may be effectuated using Texas Instruments' Code Composer which is capable of generating efficient executable object code from the "Gnu C Compiler". Other programming options include MATLAB Simulink, and MATLAB 'C' Code generator. The aforementioned techniques are an example of the steps used to achieve the executable algorithms but are not limited to this particular implementation.

Input/output modules 26, which preferably reside on a common bus, are coupled to the interface module 16, for example, simply plugged into the interface module 16, and may be any known hardware component capable of performing such functions. In one embodiment, the I/O modules are standard IndustryPack® (IP or IPACK) modules, four in this case, that mate to four, respective interface connectors. It is understood though that a different number of IPACK modules can be used in the invention. The IPACK modules should conform to the VITA 4-1995 IndustryPack® specification. These IPACK modules provide up to 50 pins per I/O connector for a total of up to 200 pins. The I/O pins are accessible via VXI front panel high-density connectors.

The foregoing structure enables the single card system 10 to constitute a re-programmable and re-configurable module that provides real-time general purpose UUT stimulus and measurement capabilities. Moreover, since the same hardware is used, which hardware can be re-configured by software for testing different electro-mechanical systems, significant savings in the testing costs are obtained (in comparison to situations where each electro-mechanical system must be tested using different hardware).

The FPGA 12 may be any SRAM or FLASH based field programmable gate array available for placement on a card. Similarly, the DSP 14 can be any digital signal processing unit available for placement on a card.

The interface module 16 may be any interface module capable of managing signals between the FPGA 12, the VXI interface 20, and the I/O modules 26, and optionally the memory component 18 when directly connected to the interface module 16. One such interface module 16 is a fixed configuration field programmable gate array (FPGA).

During operation for simulating electro-mechanical systems which require dynamic stimulus and response in order to achieve testing goals, which is primarily important when exercising closed loop control systems (servos), memory component 18 captures the results of the measurements. Characteristics of the captured data, e.g., vector length, format and parameter type, can be completely specified by the user. These measurements can be used to adjust subsequent testing of the electro-mechanical systems via system 10 or uploaded to the host via control interface 20 for analysis and storage. Memory component 18 may be deep-embedded random access memory (RAM). Although memory component is shown connected directly to the FPGA 12, it is understood that it can be arranged in other positions on the card, such as connected directly to DSP 14.

Figure 2:
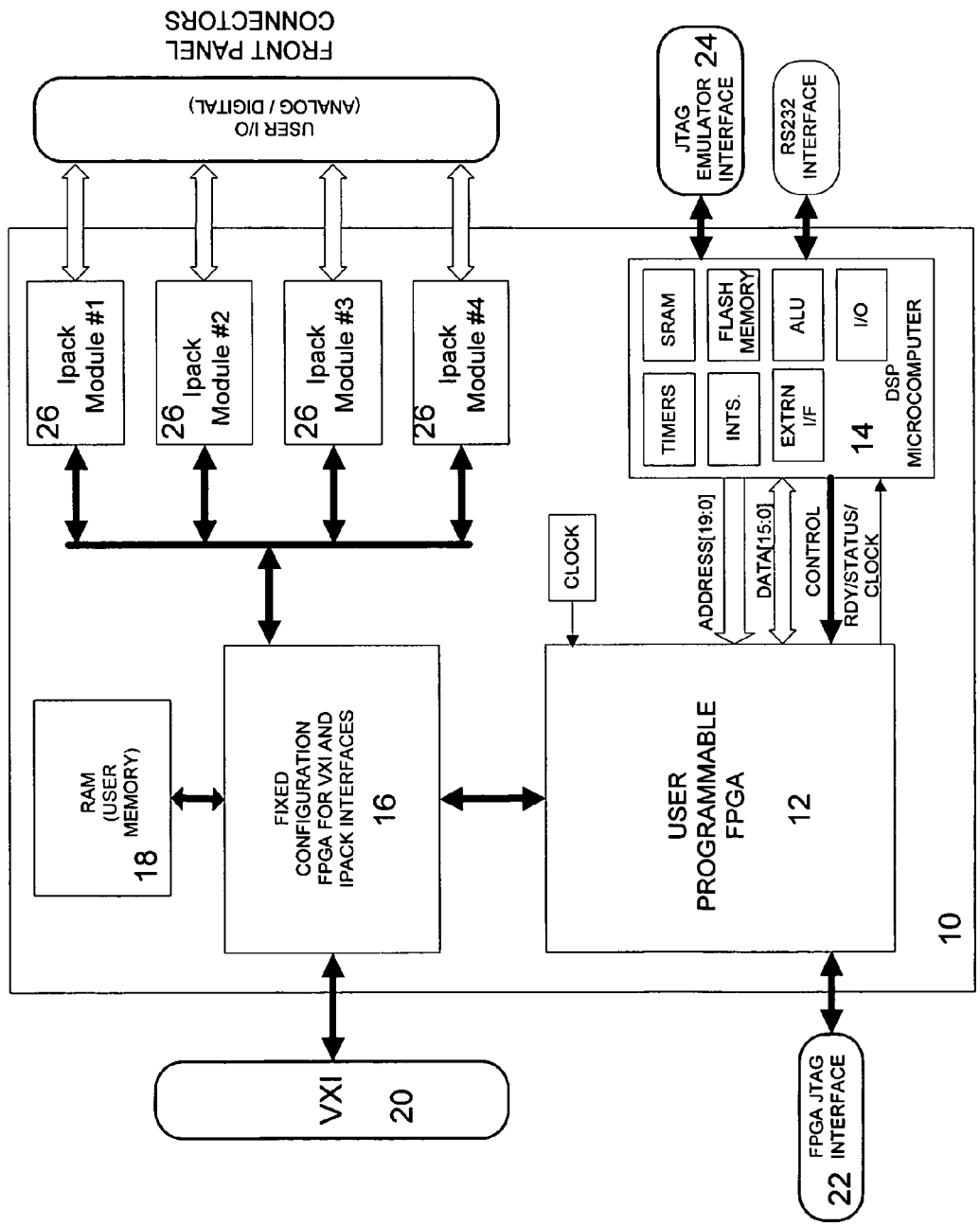
FIG. 2 is a more detailed functional block diagram of an exemplifying system in accordance with the invention.

FIG. 2 shows a more detailed block diagram of a specific implementation of a system 10 in accordance with the invention. Specifically, the interface module 16 is a fixed configuration FPGA for the VXI interface 20 and IPACK interface modules 26, the memory component 18 is a RAM, four IPACK modules 26 are provided and the components of the DSP 14 are shown. Thus, the interfaces for the memory component 18, VXI interface 20, and I/O modules 26 are implemented on a separate and dedicated FPGA serving as the interface module 16.

Additional components may be provided on the card as part of the system 10. For example, an EEPROM or other read-only memory component may be provided for storing configuration parameters and other variables.

Figure 3:
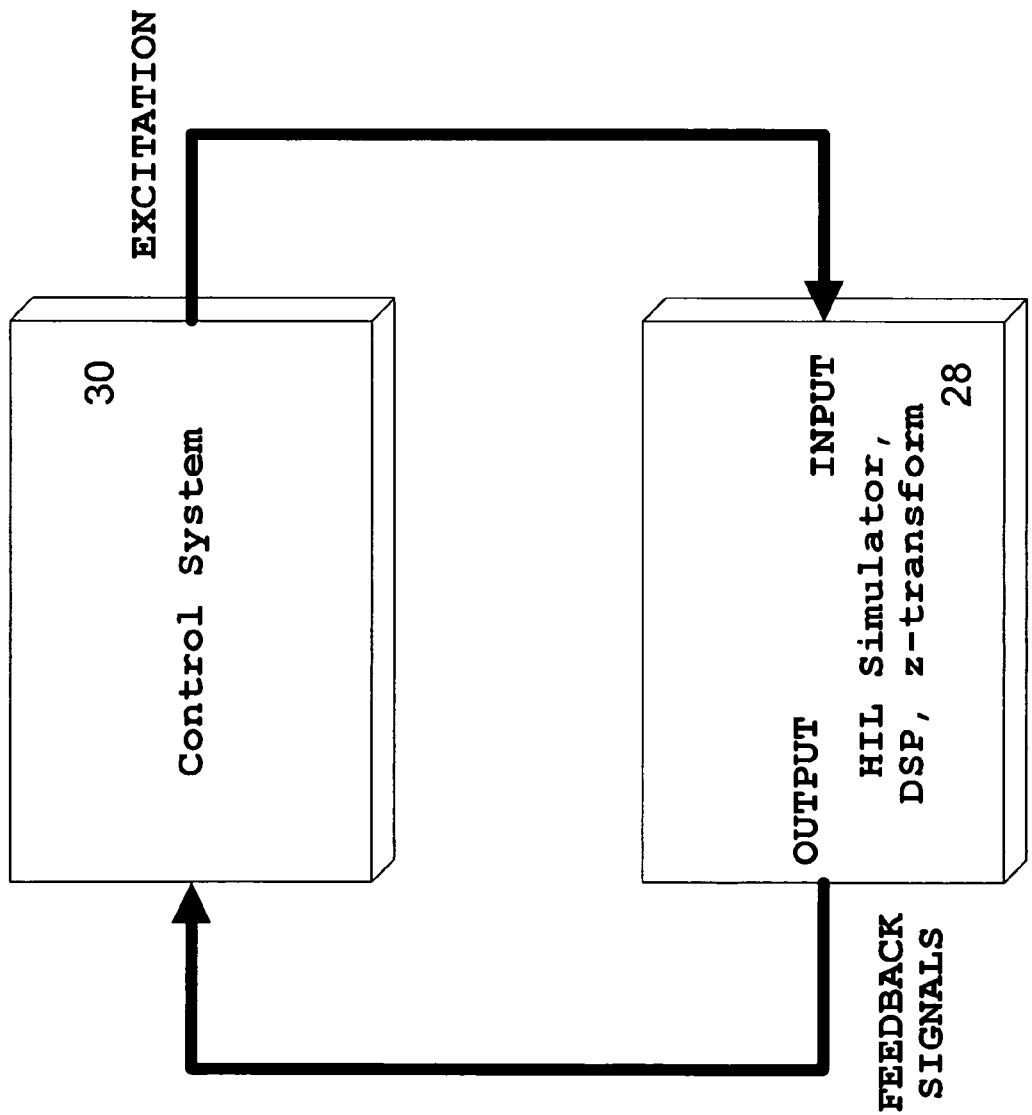
FIG. 3 shows a block diagram of a possible manner for using the system in accordance with the invention

FIG. 3 is a block diagram of the manner in which the system 10 in accordance with the invention simulates an electro-mechanical system. The system 10 is represented by block 28 and is referred to as a hardware-in-the-loop (HIL) simulator. Input excitation to the block 28 is provided from a control system 30 through the I/O modules 26. This input would be excitations generated by the control system and indicative of those which would be generated by external components coupled to the actual electro-mechanical system being simulated. The simulator block 28 performs a predetermined mathematical model, i.e., transfer function simulation using the input excitations and provides signals (feedback) to the control system 30 via I/O modules 26. The linear, time-invariant (LTI) control system 30 is then capable of altering the input excitations to be subsequently directed to the simulator block 28.

Since alteration to the simulator system 10 may be effected effortlessly, multiple test runs for a particular electro-mechanical system can be easily and readily accomplished using varying parameters or other criteria.

As an example of an electro-mechanical system being simulated by simulator block 28 would be an airborne radar antenna system consisting of an array of smaller antennas coupled to a pair of multi-horsepower brush-less DC motors which control the angular position of the antenna array. Using prior art techniques, the entire antenna system would have to be connected to a testing apparatus and parameters of the antenna system would have to be manually adjusted for multiple tests runs. However, using the system 10 in accordance with the invention, the antenna system is simulated by the system 10 so that the control system for the antenna system provides input in the form of the excitations and obtains feedback systems which represent the reaction of the antenna system to the input excitations. This reaction is represented by the feedback signals which are analyzed by the control system and typically, another set of input excitations is generated based thereon. In this manner, the reaction of the antenna system to multiple, different input excitations are assessed.

Figure 4:
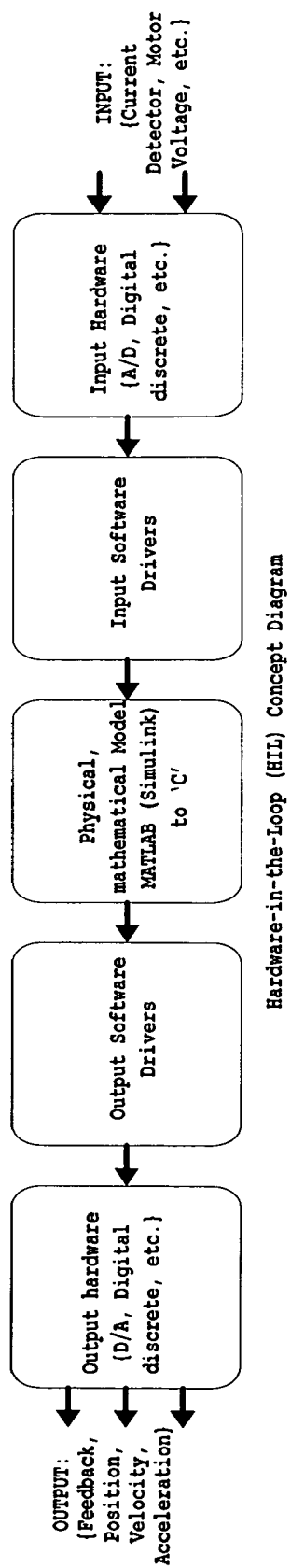
FIG. 4 shows a block diagram of the simulator portion of the block diagram shown in FIG. 3.

FIG. 4 shows a concept diagram of the hardware-in-the-loop simulator block 28 shown in FIG. 3 when applied to an antenna array system. In this case, the input excitations from control system 30 are values expected to be obtained from current detectors, motor voltage sensors and other sensors associated with the parameters to be measured within the antenna array system. These parameters are digitally quantized via the analog-to-digital converter(s) referred to as the input hardware, and appears at the FPGA 12 for pre-processing. The FPGA 12 is also considered to be part of the input hardware. The resultant digital representation from the input hardware is then presented to the digital signal processor (DSP) 14 via Input Software drivers for further computations in the physical, mathematical model portion of the hardware-in-the-loop concept diagram. Output software drivers receive the simulated reaction from the physical, mathematical model and provide digital, numeric quantities to the output hardware, i.e., digital-to-analog converters (DACs). These DACs furnish feedback output signals such as position data, velocity data, acceleration data, etc. This data can be used to generate another set of time dependent input excitations for subsequent input to the input hardware.

Additional details of simulation of an antenna array system are found in U.S. patent application Ser. No. 11/559,061 filed Nov. 13, 2006, incorporated by reference herein.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

The invention claimed is:

1. An arrangement for simulating electro-mechanical systems, comprising:
    a simulator that simulates a plurality of different electro-mechanical systems in dependence upon receipt of specific commands or programs to enable simulation of each of the different electro-mechanical systems, said simulator comprising a user-programmable field programmable gate array and a digital signal processing unit coupled to said field programmable gate array, the commands or programs being received for each of said field programmable gate array and said digital signal processing unit for each of the electro-mechanical systems to be simulated;
    a first interface that enables said simulator to interface with a host computer;
    a second interface that enables said simulator to interface with input/output devices;
    a third interface through which said field programmable gate array is programmed and configured, said field programmable gate array receiving algorithms for its configuration through said third interface; and
    a fourth interface through which said digital signal processing unit is programmed and configured, said digital signal processing unit receiving algorithms for its configuration through said fourth interface;
    wherein after receiving commands or programs created for a particular electro-mechanical system to be simulated via said third and fourth interfaces, respectively, and being configured in accordance with the commands or programs, said field programmable gate array and said digital signal processing unit in combination simulate operation of the different electro-mechanical systems such that when control signals are generated using the input/output devices and directed to said simulator via said first or second interface, said simulator generates feedback signals indicative of a response of said simulator to the generated control signals to enable monitoring of the feedback signals from said simulator.

2. The arrangement of claim 1, wherein said first interface is coupled to said field programmable gate array.

3. The arrangement of claim 1, wherein said third interface comprises a first JTAG interface connected to said field programmable gate array and said fourth interface comprises a second JTAG interface connected to said digital signal processing unit.

4. The arrangement of claim 1, wherein said simulator is arranged on a single instrument adapted for insertion into a single slot of said host computer, said first and second interfaces being arranged on said single instrument.

5. The arrangement of claim 4, further comprising a memory component coupled to said simulator and being arranged on said single instrument.

6. The arrangement of claim 4, wherein said first interface comprise an interface module connectable to said host computer and said second interface comprises at least one input/output module connected to said interface module, each of said at least one input/output module being connectable to an input/output device, said interface module being arranged on said single instrument.

7. The arrangement of claim 6, wherein said at least one input/output module comprises a plurality of input/output modules.

8. The arrangement of claim 6, wherein said interface module is arranged to manage signals between said field programmable gate array, said first interface to said host computer and said at least one input/output module.

9. The arrangement of claim 6, wherein said interface module is a fixed configuration field programmable gate array.

10. The arrangement of claim 1, wherein said first interface comprises an interface module connectable to said host computer and said second interface comprises at least one input/output module connected to said interface module, each of said at least one input/output module being connectable to an input/output device.

11. The arrangement of claim 10, wherein said at least one input/output module comprises a plurality of input/output modules.

12. The arrangement of claim 10, wherein said interface module is arranged to manage signals between said field programmable gate array, said first interface to said host computer and said at least one input/output module.

13. The arrangement of claim 10, wherein said interface module is a fixed configuration field programmable gate array.

14. A method for simulating electro-mechanical systems, comprising:

creating a plurality of programs to be implemented by a simulator capable of simulating operation of different electro-mechanical systems, the simulator comprising a user-programmable field programmable gate array and a digital signal processing unit coupled to the field programmable gate array, the step of creating programs comprising creating commands or programs for each of the field programmable gate array and the digital signal processing unit for each of the electro-mechanical systems to be simulated;

mounting the simulator on a single instrument card;

inserting the single instrument card into connection with a host computer and providing a first interface that enables the simulator to interface with the host computer;

mounting the first interface on the single instrument card and coupling it to the simulator to enable the simulator to be linked to the host computer;

providing a second interface that enables the simulator to interface with input/output devices;

providing a third interface through which the field programmable gate array is programmed and configured, the field programmable gate array receiving commands or programs for its configuration through said third interface;

providing a fourth interface through which the digital signal processing unit is programmed and configured, the digital signal processing unit receiving commands or programs for its configuration through the fourth interface;

directing the commands or programs created for a particular electro-mechanical system to the simulator via the third and fourth interfaces to program and configure the field programmable gate array and the digital signal processing unit to simulate that electro-mechanical system;

generating control signals at the input/output devices via at least one user interface;

directing the generated control signals from the input/output devices to the simulator through the interface module such that the simulator generates feedback signals indicative of a response of the simulator to the generated control signals; and monitoring the feedback signals from the simulator.

15. The method of claim 14, further comprising:

mounting a memory component on the single instrument card and coupling it to the simulator; and capturing results of the simulation in the memory component.

16. The method of claim 14, further comprising managing the control signals and the feedback signals via the interface module.

17. The method of claim 14, wherein the step of directing the commands or programs created for a particular electro-mechanical system to the simulator to program and configure the field programmable gate array and the digital signal processing unit to simulate that electro-mechanical system comprises directing the commands or programs to each of the field programmable gate array and digital signal processing unit via respective interfaces.

18. The method of claim 14, further comprising providing the interface module with a plurality of connections for receiving input/output modules capable of linking to the input/output devices.

19. The method of claim 14, further comprising varying the control signals being generated at the input/output devices via at least one user interface and directed to the simulator based on previously generated feedback signals.

20. The method of claim 14, further comprising generating the control signals that are generated at the input/output devices via at least one user interface to be indicative of those which would be generated by external components coupled to the actual electro-mechanical system being simulated.

\* \* \* \* \*